United States Patent
Lee et al.

(10) Patent No.: US 10,031,188 B2
(45) Date of Patent: Jul. 24, 2018

(54) SYSTEM FOR ESTIMATING STATE OF HEALTH OF BATTERY OF ELECTRIC VEHICLE

(71) Applicant: SAMSUNG SDI CO., LTD., Yongin-si, Gyeonggi-do (KR)

(72) Inventors: Jiho Lee, Yongin-si (KR); Jeongmin Shin, Yongin-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 529 days.

(21) Appl. No.: 14/665,239

(22) Filed: Mar. 23, 2015

(65) Prior Publication Data

US 2016/0202323 A1 Jul. 14, 2016

(30) Foreign Application Priority Data

Jan. 8, 2015 (KR) .................. 10-2015-0002635

(51) Int. Cl.
*H02J 7/14* (2006.01)
*G01R 31/36* (2006.01)

(52) U.S. Cl.
CPC ....... *G01R 31/3651* (2013.01); *G01R 31/362* (2013.01); *G01R 31/3679* (2013.01); *G01R 31/3662* (2013.01)

(58) Field of Classification Search
CPC .. G01R 31/3651; G01R 31/362; H02J 7/0077
USPC ........................ 320/104, 134, 136; 324/433
See application file for complete search history.

(56) References Cited

U.S. PATENT DOCUMENTS

| 2004/0008031 A1* | 1/2004 | Arai ............. H01M 10/48 324/429 |
| 2007/0090803 A1 | 4/2007 | Yun et al. |
| 2012/0105006 A1* | 5/2012 | Hara ............. H01M 4/5825 320/128 |
| 2013/0069425 A1* | 3/2013 | Kanazawa ....... B60L 11/1816 307/9.1 |

FOREIGN PATENT DOCUMENTS

| JP | 2002-236156 | 8/2002 |
| JP | 2006-220617 | 8/2006 |
| JP | 2007-179968 | 7/2007 |
| KR | 2007-0043150 A | 4/2007 |

\* cited by examiner

*Primary Examiner* — Edward Tso
*Assistant Examiner* — Aaron Piggush
(74) *Attorney, Agent, or Firm* — Lee & Morse, P.C.

(57) ABSTRACT

A system for estimating the state of health (SOH) of a battery of an electric vehicle includes a charger recognition unit, a discharge instruction unit, and an SOH estimator. The charge recognition unit generates a charge recognition signal based on a charge state of the battery. The discharge instruction unit receives the charge recognition signal when the battery reaches at least one predetermined charge voltage value, temporarily stops charging of the battery, and discharges the battery to a certain level. Discharge is performed by operating at least one function of the electric vehicle. The SOH estimator estimates the SOH of the battery based on a voltage change measured during discharging of the battery based on the at least one predetermined current value.

20 Claims, 4 Drawing Sheets

SYSTEM FOR ESTIMATING STATE OF HEALTH OF BATTERY OF ELECTRIC VEHICLE

CROSS-REFERENCE TO RELATED APPLICATION

Korean Patent Application No. 10-2015-0002635, filed on Jan. 8, 2015, and entitled, "System for Estimating State of Health of Battery of Electric Vehicle," is incorporated by reference herein in its entirety.

BACKGROUND

1. Field

One or more embodiments described herein relate to a system for estimating the state of health of a battery of an electric vehicle.

2. Description of the Related Art

A secondary battery is used to power an electric vehicle. The lifespan of the battery may be estimated by a battery management system (BMS). In one proposed system, the voltage change related to the charging and discharging of the battery is periodically measured. Based on this measurement, the internal resistance of the battery may be determined and compared with an initial resistance of the battery. This comparison is used to provide an indication of the degree to which battery resistance has increased over time, which thereby provides a basis for estimating battery lifespan.

SUMMARY

In accordance with one or more embodiments, a system for estimating a state of health (SOH) of a battery of an electric vehicle includes a charge detector to generate a charge recognition signal based on a charge state of the battery; a discharge controller to receive the charge recognition signal when the battery reaches at least one predetermined charge voltage value and to temporarily stop charging of the battery, and to operate at least one function of the electric vehicle to discharge the battery based on at least one predetermined current value for a predetermined time; and an SOH estimator to estimate the SOH of the battery based on a voltage change measured during discharging the battery based on the at least one predetermined current value.

The charge detector may determine the charge state of the battery based on a battery voltage increase. The charge detector may include a sensor to sense a connection state of an external charge terminal of the electric vehicle and an external charger to charge the battery. The charge detector may generate the charge recognition signal when a starter of the electric vehicle is turned off or the electric vehicle stops moving.

The SOH estimator may include a voltage detector to measure voltages of the battery based on a plurality of predetermined current values; a data calculator to calculate a resistance value and a power value of the battery based on the predetermined current values, the resistance value and power value to be calculated based on a variation in the voltages measured by the voltage detector; and an SOH determiner to determine a current SOH of the battery based on a comparison of the resistance value and the power value with a pre-stored resistance value and a pre-stored power value.

The system may include a data storage device to store data for the voltages measured by the voltage detector and to supply the data to the data calculator. The system may include a display to display information indicative of the SOH of the battery estimated by the SOH estimator. The discharge controller may set the at least one predetermined charge voltage value and the at least one predetermined current value. The discharge instructor controller may set a plurality of predetermined charge voltage values and is to set different predetermined current values corresponding to the predetermined charge voltage values. The at least one function may includes operation of a motor of the electric vehicle or operation and one or more electrical functions of the vehicle.

In accordance with one or more other embodiments, an n apparatus for an electric vehicle includes first logic to determine a charge state of a charging battery of the vehicle; second logic to temporarily stop charging the battery based on the charge state, and to operate at least one function of the vehicle to discharge the battery; and third logic to estimate the state of health (SOH) of the battery based on a voltage change measured during discharge of the battery, wherein the first logic is to determine the charge state of the battery based on a signal from a battery management system at a time when the vehicle is not moving.

The second logic may temporarily stop charging of the battery when a charge voltage value of the battery equals at least one predetermined value. The second logic may operate the at least one function to discharge the battery for a predetermined time based on a predetermined current value. The second logic may temporarily stop charging of the battery when a charge voltage value of the battery equals a first predetermined value, discharge the battery to a first level based on the at least one function, control charging of the battery to increase the charge voltage, temporarily stop charging of the battery when the charge voltage value of the battery equals a second predetermined value, discharge the battery to a second level based on the at least one function, and control charging of the battery to increase the charge voltage.

The first predetermined value may be equal to the second predetermined value. The first predetermined value may be different from the second predetermined value. The first level may be equal to the second level. The first level may be different from the second level. The at least one function may be at least one of operating a motor of the vehicle or an electrical system of the vehicle. The time when the vehicle is not moving may include at least one of a time when a starter of the vehicle is not activated.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
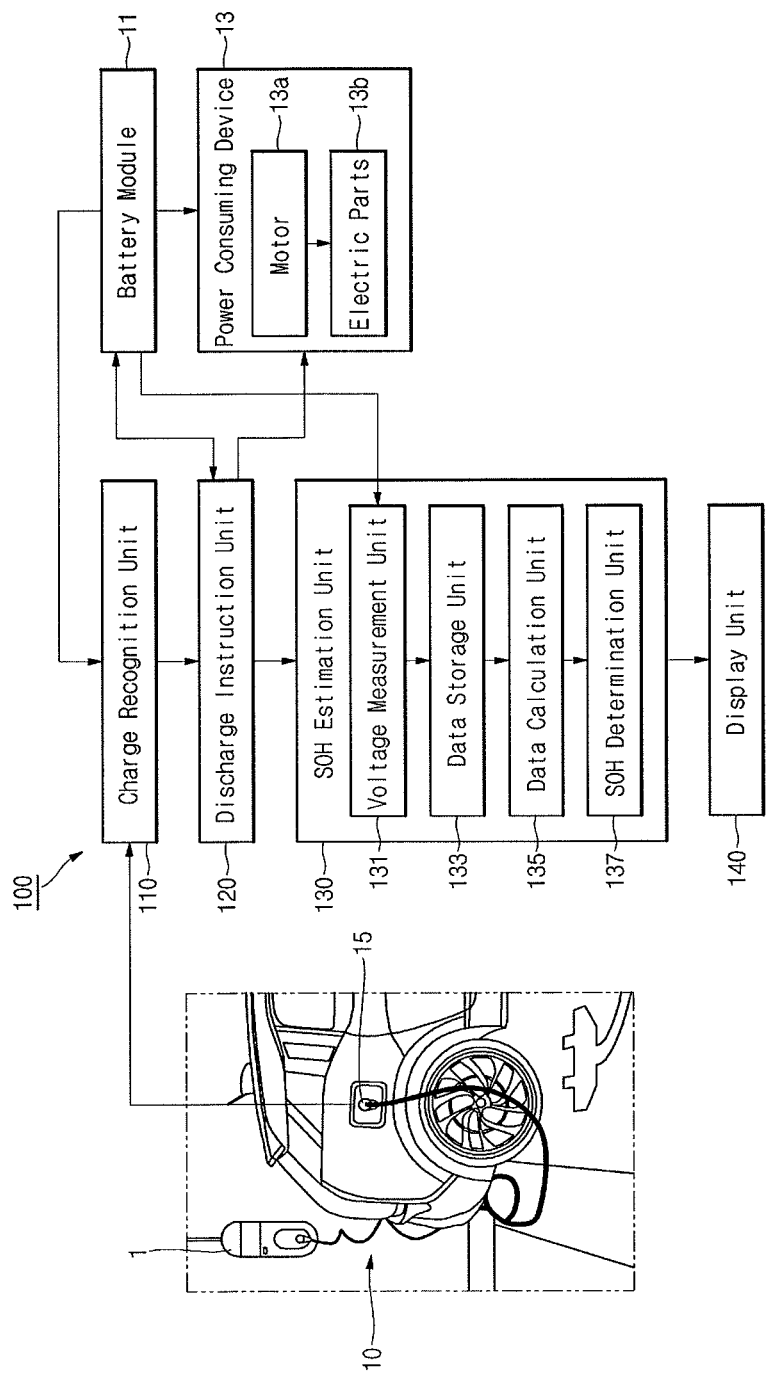
FIG. 1 illustrates an embodiment of a system for estimating the state of health of a battery of an electric vehicle.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout. Embodiments may be combined to form additional embodiments.

FIG. 1 illustrates an embodiment of a system 100 for estimating the state of health (SOH) of a battery, which, for example, may be used to power an electric vehicle. The vehicle may be one that is powered solely by electricity or a hybrid electric vehicle.

Referring to FIG. 1, the system 100 includes a charge recognition unit 110, a discharge instruction unit 120, and an SOH estimation unit 130. In addition, the battery SOH estimating system 100 may further include a display unit 140.

In one embodiment, the battery SOH estimating system 100 may be physically separated from and/or functionally different from a battery management system (BMS) of a battery module 11 in the electric vehicle 10. For example, the battery module 11 may include a BMS to control charging and discharging of battery cells, to protect the battery cells from over-charging or over-discharging, and/or to perform cell balancing. By contrast, the battery SOH estimating system 100 may be a separate system for managing the battery module 11 of electric vehicle 10, though it may operate with the BMS. In one alternative embodiment, the battery SOH estimating system 100 may be included in the BMS.

The charge recognition unit 110 determines the charge state of the battery module 11 and outputs a corresponding charge recognition signal. Because the BMS measures voltages of battery cells, the charge recognition unit 110 is connected to the BMS of the battery module 11 to detect from the BMS whether or not a voltage increase has occurred. For example, if the battery cells of the battery module 11 have been or are being charged, the charge recognition unit 110 detects a voltage increase of the battery cells from the BMS and determines that the battery module 11 is in a charging or charged state.

In addition, unlike a hybrid vehicle, the electric vehicle 10 may receive power from an external charge device 1 for charging the battery module 11. In this case, the external charge device 1 may charge the battery module 11 through the external charge terminal 15 of the electric vehicle 10. Therefore, in one embodiment, the charge recognition unit 110 may be in the external charge terminal 15, for example, in the form of a sensor which senses the connection state of the external charge terminal 15 and the external charge device 1.

As described above, the charge recognition unit 110 may be connected to the BMS of the battery module 11 in order to recognize the charge state of a battery cell, or may be installed in the external charge terminal 15 in the form of a sensor to recognize the charge state of a battery cell by the external charge device 1. However, when the electric vehicle 10 is in motion (e.g., being driven), the charge recognition unit 110 may not output a charge recognition signal. For example, even if the charge state of the battery module 11 is recognized in the above-described manner, the charge recognition unit 110 may not output a charge recognition signal when the starter of the electric vehicle 10 is turned on or when the electric vehicle 10 is driving. As a result, an SOH estimating process may not be performed.

Therefore, if the charge recognition unit 110 recognizes the charge state of the battery module 11 in a state in which a starter of the electric vehicle 10 is turned off or the electric vehicle 10 otherwise stops or is not moving, the charge recognition unit 110 may output the charge recognition signal. The charge recognition unit 110 may be connected to a motor management system of the electric vehicle 10 and may recognize whether to start or stop the electric vehicle 10.

The discharge instruction unit 120 may receive the charge recognition signal from the charge recognition unit 110 and monitor charge voltages of the battery module 11 through the BMS of the battery module 11. If the charge voltage value of the battery module 11 reaches at least one predetermined charge voltage value, charging of the battery module 11 may be temporarily stopped.

When charging of the battery module 11 is temporarily stopped, the discharge instruction unit 120 may operate at least one power consuming device 13 in the electric vehicle 10 to discharge the battery module 11 with at least one predefined current value for a predetermined time. The power consuming device 13 may include a motor 13a driven by power of the battery module 11, and various electric parts 13b or a separate discharge circuit.

The discharge instruction unit 120 may set one or more predetermined charge voltage values and one or more predetermined discharge current values. For example, when one predetermined charge voltage value is set in the discharge instruction unit 120, one predetermined discharge current value may be set to correspond to the set charge voltage value. When multiple predetermined charge voltage values is set in the discharge instruction unit 120, multiple predetermined discharge current values may be set to correspond to the set charge voltage values may be set. The multiple predetermined charge voltage values may be equal or different from one another, and the multiple predetermined discharge current values may be different from one another.

When the battery module 11 reaches one or more of the set charge voltage value, the discharge instruction unit 120 may operate the motor 13a or/and the electric parts 13b (e.g., a heating wire sheet, a heating wire, an air conditioner) to discharge the battery module 11 with one or more of the corresponding predetermined current values for a predetermined time.

The SOH estimation unit 130 may measure voltages of the battery module 11 according to the predetermined current values during discharging of the battery module 11, and may estimate a current state of health of the battery module 11 based on changes in the measured voltages.

In one embodiment, the SOH estimation unit 130 includes a voltage measurement unit 131, a data storage unit 133, a data calculation unit 135, and an SOH determination unit 137. The voltage measurement unit 131 may measure voltages of the battery for a predetermined time, during which the battery module 11 is discharged by the power consuming device 13 with the predetermined current value.

The data storage unit 133 may store voltage values measured by the voltage measurement unit 131 and may supply stored data to the data calculation unit 135. The data stored in and supplied from the data storage unit 133 may include, for example, discharge current values of the battery module 11 and.or variations of voltages measured while the battery module 11 is discharged. The data storage unit 133 may also store result data output from the SOH determination unit 137, e.g., data indicative of the current state of health of the battery.

The data calculation unit 135 may calculate a resistance value R and a maximum power value P of the battery based on the data of the data storage unit 133. For example, the data calculation unit 135 may calculate the resistance value R and the maximum power value P of the battery by applying a voltage variation $\Delta V$ and a discharge current value I of the battery to Ohm's law (V=IR) and a power calculating equation (P=VI).

The SOH determination unit 137 may determine the current SOH of the battery by comparing the resistance value R and the maximum power value P of the battery with resistance and power values pre-stored in a look-up table for the SOH of the battery. The look-up table may include resistance values and power values of the battery for various states of health of the battery. Therefore, the SOH determination unit 137 may look up an SOH of the battery corresponding to the calculated resistance value R and the maximum power value P of the battery to determine the current SOH of the battery.

The display unit 140 may display the result estimated by the SOH estimation unit 130 for user information. For example, the display unit 140 may be embodied as an instrument board, a navigation device, or a lamp of the electric vehicle 10 and, for example, may be indicated as a percentage (%).

Figure 2:
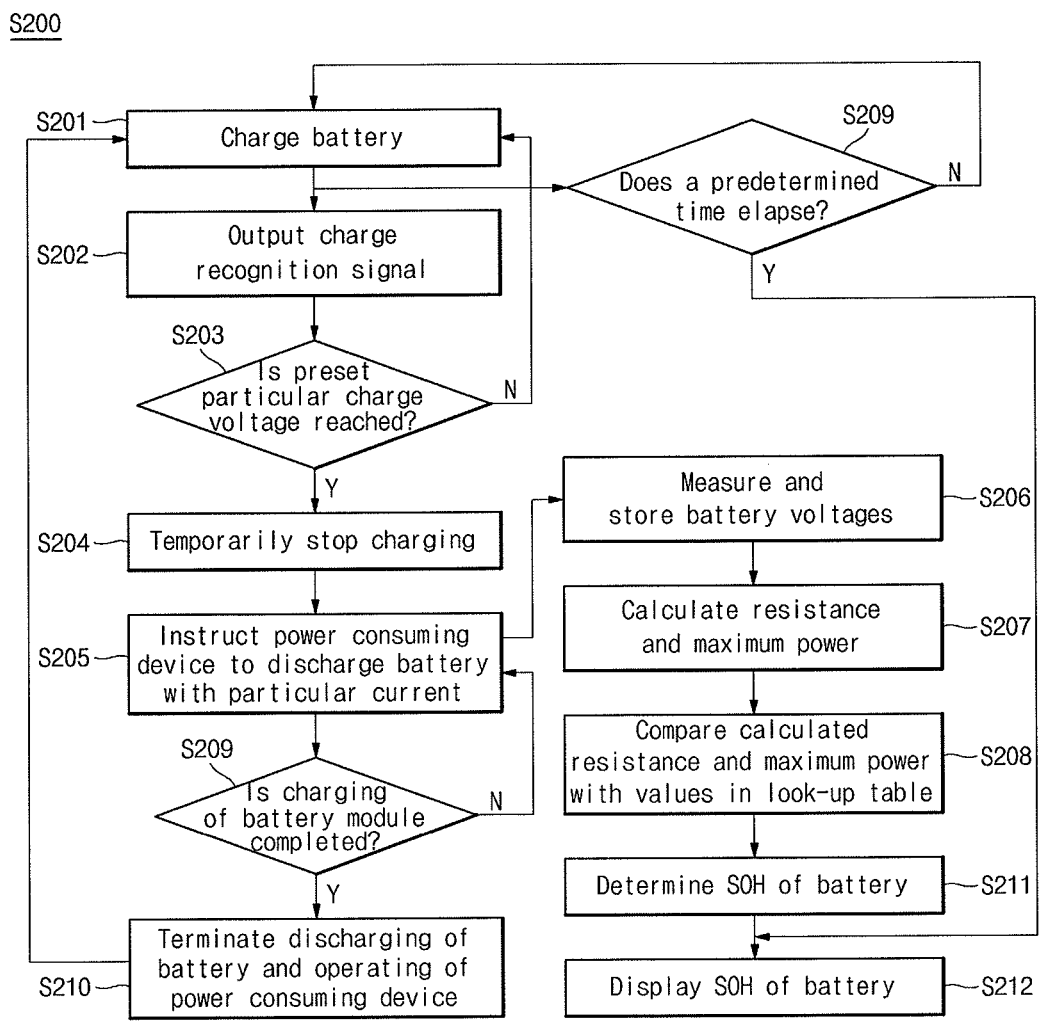
FIG. 2 illustrates an embodiment of a method for estimating the state of health of a battery of an electric vehicle.

FIG. 2 illustrates an embodiment of a method (S200) for estimating the SOH of a battery of an electric vehicle. In an initial operation of this method, when charging the battery module 11 in the electric vehicle 10 is started by the external charge device 1 (S201), the charge recognition unit 110 recognizes charging of the battery module 11 through a sensor in the BMS of the battery module 11 or the external charge terminal 15.

The charge recognition unit 110 checks whether the starter of the electric vehicle 10 is turned off or the electric vehicle 10 has stopped moving. When the starter of the electric vehicle 10 is turned off or the electric vehicle 10 has stopped moving, the charge recognition unit 110 outputs a charge recognition signal to the discharge instruction unit 120 (S202). However, when the starter of the electric vehicle 10 is turned on or the electric vehicle 10 is driving, the charge recognition unit 110 does not output the charge recognition signal and the SOH estimating process is not performed for the battery.

When data required for evaluating the lifespan of the battery is obtained during driving of the electric vehicle 10, the battery lifespan may be evaluated under various conditions according to driving conditions and/or driving habits of the driver. This may make it difficult to obtain an accurate evaluation result. In accordance with one or more embodiments, data for determining the lifespan of a vehicle battery is determined while the vehicle is not in motion, e.g., in park, stopped at a traffic light, or otherwise not in motion. Determining data while the vehicle is not in motion may produce a more accurate result of battery lifespan, because the data is unaffected by driving conditions and/or habits of the driver.

Thereafter, the discharge instruction unit 120 checks whether the battery reaches a preset charge voltage while monitoring voltages of the battery together with the BMS of the battery module 11 (S203). If the battery reaches the preset charge voltage (S203), the discharge instruction unit 120 temporarily stops charging the battery (S204) and instructs the power consuming device 13 in the electric vehicle 10 to discharge the battery with a predetermined current for a predetermined time (S205). For example, the discharge instruction unit 120 may instruct the motor 13a to idle at about 2000 rpm for 10 seconds to discharge the battery with 200 A for 10 seconds.

The voltage measurement unit 131 may measure voltages of the battery during discharging of the battery, and the data storage unit 133 may store the data measured by the voltage measurement unit 131 (S206). The data stored in the data storage unit 133 may include discharge current values of the battery module 11 and variations of voltages measured while the battery is discharged.

Next, the data calculation unit 135 may calculate the resistance value R and the maximum power value P of the battery based on the data stored in the data storage unit 133 (S207). For example, the data calculation unit 135 may calculate the resistance value R and the maximum power value P of the battery by applying a voltage variation $\Delta V$ and a discharge current value I of the battery to the Ohm's law (V=IR) and a power calculating equation (P=VI).

Then, the SOH determination unit 137 may determine the current SOH of the battery (S211) by comparing the resistance value R and the maximum power value P of the battery, which are calculated by the data calculation unit 135, with resistance and power values, which are pre-stored in a look-up table (S208). The look-up table may include resistance values and power values of the battery for various states of health of the battery. Therefore, the SOH determination unit 137 may look up an SOH of the battery corresponding to the calculated resistance value R and the maximum power value P of the battery to determine the current SOH of the battery.

If the predetermined time elapses after discharging the battery (S209), the discharge instruction unit 120 terminates discharging of the battery and operation of the power consuming device 13 (S210), and recharges the battery (S201).

If a particular charge voltage is additionally set (S203), the discharge instruction unit 120 and the SOH estimation unit 130 temporarily stop charging the battery and repeatedly perform the above-described process. In one embodiment, the discharge instruction unit 120 may perform the above-described process while varying the discharge current values. For example, while the discharge instruction unit 120 instructs the motor 13a to idle at about 2000 rpm for 10 seconds to discharge the battery with 200 A for 10 seconds in the previous stage, the discharge instruction unit 120 may instruct the motor 13a to idle at about 1000 rpm to discharge the battery with 100 A in the current stage. In addition, the discharge instruction unit 120 may instruct not only the motor 13a but also the electric parts 13b (e.g., a heating wire sheet, a heating wire or an air conditioner) to operate. For example, the discharge instruction unit 120 may operate the heating wire sheet for 10 seconds to discharge the battery with 50 A for 10 seconds.

Thereafter, charging of the battery module 11 is completed (S209), and the SOH of the battery estimated by the SOH estimation unit 130 is displayed to a user through the display unit 140 (S212). The display unit 140 may be embodied, for example, as an instrument board, a navigation device, or a lamp of the electric vehicle 10 and, for example, may be indicated as a percentage (%).

Figure 3:
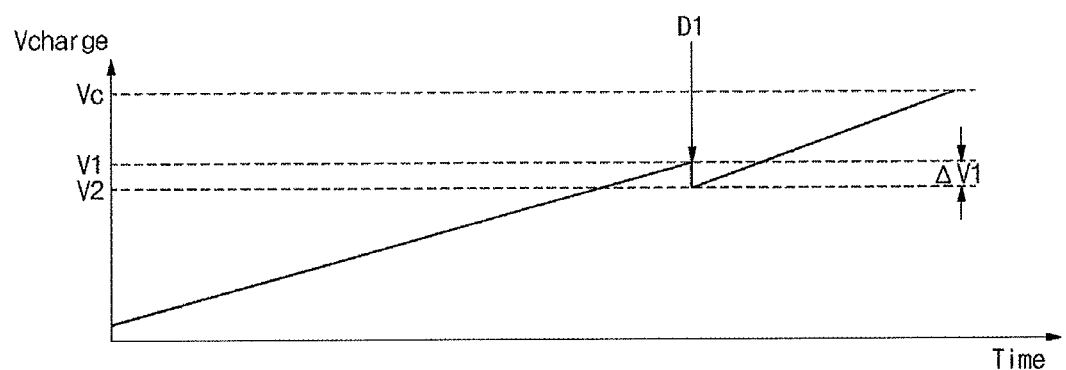
FIG. 3 illustrates an embodiment of a method for discharging a battery.

FIG. 3 illustrates an embodiment of a method for discharging a battery with one current at one charge voltage.

Figure 4:
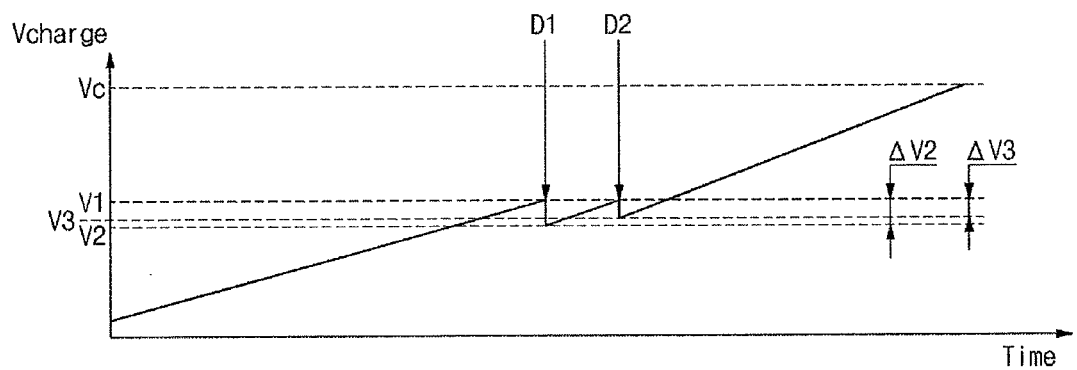
FIG. 4 illustrates an embodiment of a method for discharging multiple batteries.
Figure 5:
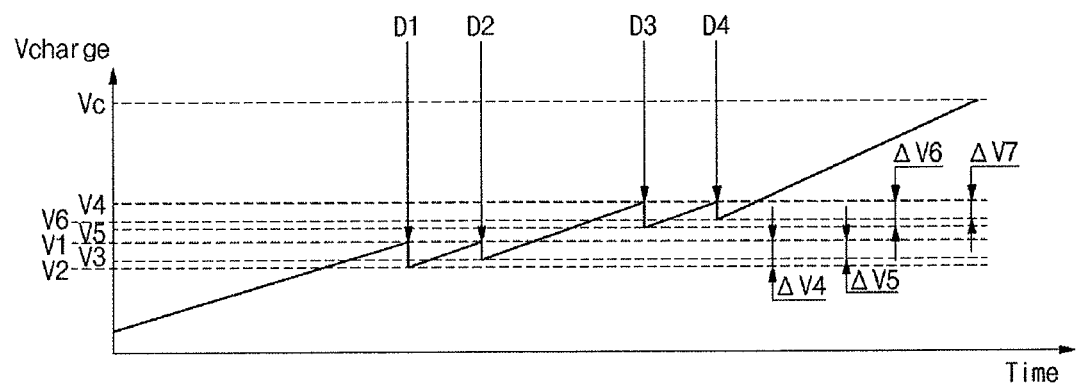
FIG. 5 illustrates an embodiment of a method for additionally discharging batteries using the discharging method in FIG. 4.
Figure 6:
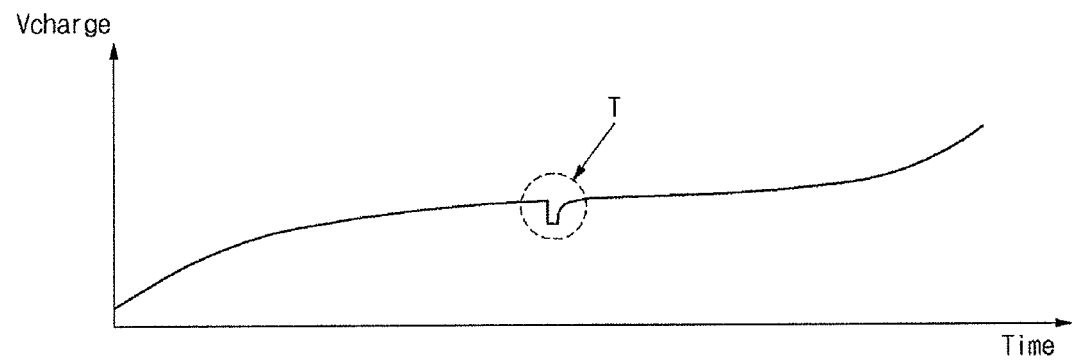
FIG. 6 illustrates an example of the charge or discharge state of a battery which has been subject to one or more of the aforementioned embodiments.

FIG. 4 illustrates an embodiment of a method for discharging batteries with different currents at two charge voltages. FIG. 5 illustrates an embodiment of a method for additionally discharging batteries using the discharging method in FIG. 4 at different charge voltages. FIG. 6 is a graph illustrating an example of a charge or discharge state of a battery which has undergone a battery state of health (SOH) estimating process.

Referring to FIG. 3, discharging the battery at a particular charge voltage V1 is performed at (D1). As a result, one corresponding voltage variation ΔV1 is obtained.

Referring to FIG. 4, discharging the battery at two particular charge voltages V1, which are equal to each other, is performed at D1 and D2. As a result, two corresponding voltage variations ΔV2 and ΔV3 are obtained. In this case, discharging the battery is performed twice. In one embodiment, the discharging operations may be performed with different discharge current values.

Referring to FIG. 5, discharging the battery at four particular charge voltages V1 and V4, pairs of which are equal to each other, is performed at D1, D2, D3, and D4). As a result, four voltage variations ΔV4, ΔV5, ΔV6, and ΔV7 are obtained. In this case, discharging the battery is performed four times. In one embodiment, the discharging operations for the same charge voltage may be performed with different discharge current values.

The charge recognition unit, discharge instruction unit, calculators, estimating systems, controllers, and other processing features of the embodiments described herein may be implemented in logic which, for example, may include hardware, software, or both. When implemented at least partially in hardware, the charge recognition unit, discharge instruction unit, estimating systems, calculators, controllers, and other processing features of the embodiments described herein may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the charge recognition unit, discharge instruction unit, estimating systems, and other processing features of the embodiments described herein may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

By way of summation and review, a current BMS is only able to estimate battery lifespan while the vehicle is in motion. Consequently, the lifespan estimate of the BMS is performed under conditions that vary based on driving conditions or driving habits. As a result, it is difficult to obtain an accurate and reliable estimate of battery lifespan. In accordance with one or more of the aforementioned embodiments, data for determining the lifespan of a battery of a vehicle is determined when the vehicle is not moving. As a result, a more accurate and reliable evaluation result of battery lifespan may be determined, while reducing or minimizing the processing burden of the vehicle BMS.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A system for estimating a state of health (SOH) of a battery of an electric or hybrid vehicle, the system comprising:
   a charge detector to generate a charge recognition signal based on a charge state of the battery when the vehicle is not moving;
   a discharge controller to receive the charge recognition signal when the battery reaches at least one predetermined charge voltage value, to temporarily stop charging of the battery, and to operate at least one function of the vehicle to discharge the battery based on at least one predetermined current value for a predetermined time while the vehicle is not moving; and
   an SOH estimator to estimate the SOH of the battery based on a voltage change measured during discharging the battery while the vehicle is not moving based on the at least one predetermined current value.

2. The system as claimed in claim 1, wherein the charge detector is to determine the charge state of the battery based on a battery voltage increase.

3. The system as claimed in claim 1, wherein the charge detector includes a sensor to sense a connection state of an external charge terminal of the vehicle and an external charger to charge the battery.

4. The system as claimed in claim 1, wherein the charge detector is to generate the charge recognition signal when a starter of the vehicle is turned off or the electric vehicle stops moving.

5. The system as claimed in claim 1, wherein the SOH estimator includes:
   a voltage detector to measure voltages of the battery based on a plurality of predetermined current values;
   a data calculator to calculate a resistance value and a power value of the battery based on the predetermined current values, the resistance value and power value to be calculated based on a variation in the voltages measured by the voltage detector; and
   an SOH determiner to determine a current SOH of the battery based on a comparison of the resistance value and the power value with a pre-stored resistance value and a pre-stored power value.

6. The system as claimed in claim 5, further comprising:
   a data storage device to store data for the voltages measured by the voltage detector and to supply the data to the data calculator.

7. The system as claimed in claim 1, further comprising:
   a display to display information indicative of the SOH of the battery estimated by the SOH estimator.

8. The system as claimed in claim 1, wherein: the discharge controller is to set the at least one predetermined charge voltage value and the at least one predetermined current value.

9. The system as claimed in claim 1, wherein:
the discharge controller is to set a plurality of predetermined charge voltage values and is to set different predetermined current values corresponding to the predetermined charge voltage values.

10. The system as claimed in claim 1, wherein the at least one function includes operation of a motor of the vehicle or operation and one or more electrical functions of the vehicle.

11. An apparatus for an electric or hybrid vehicle, the apparatus comprising:
first logic to determine a charge state of a charging battery of the vehicle when the vehicle is not moving;
second logic to temporarily stop charging the battery based on the charge state, and to operate at least one function of the vehicle to discharge the battery while the vehicle is not moving; and
third logic to estimate the state of health (SOH) of the battery based on a voltage change measured during discharge of the battery while the vehicle is not moving, wherein the first logic is to determine the charge state of the battery based on a signal from a battery management system at a time when the vehicle is not moving, wherein the first logic, second logic, and third logic are non-transitory computer-implemented logic or circuit-based logic.

12. The apparatus as claimed in claim 11, wherein the second logic is to temporarily stop charging of the battery when a charge voltage value of the battery equals at least one predetermined value.

13. The apparatus as claimed in claim 12, wherein the second logic is to operate the at least one function to discharge the battery for a predetermined time based on a predetermined current value.

14. The apparatus as claimed in claim 11, wherein the second logic is to:
temporarily stop charging of the battery when a charge voltage value of the battery equals a first predetermined value,
discharge the battery for a first predetermined time or with a first predetermined current based on the at least one function,
control charging of the battery to increase the charge voltage,
temporarily stop charging of the battery when the charge voltage value of the battery equals a second predetermined value,
discharge the battery for a first predetermined time or with a first predetermined current based on the at least one function, and
control charging of the battery to increase the charge voltage.

15. The apparatus as claimed in claim 14, wherein the first predetermined value is equal to the second predetermined value.

16. The apparatus as claimed in claim 14, wherein the first predetermined value is different from the second predetermined value.

17. The apparatus as claimed in claim 14, wherein the first predetermined time or first predetermined current is equal to the second predetermined time or the second predetermined current.

18. The apparatus as claimed in claim 14, wherein the first predetermined time or first predetermined current is different from the second predetermined time or the second predetermined current.

19. The apparatus as claimed in claim 14, wherein the at least one function is at least one of operating a motor of the vehicle or an electrical system of the vehicle.

20. The apparatus as claimed in claim 14, wherein the time when the vehicle is not moving includes at least one of a time when a starter of the vehicle is not activated.

\* \* \* \* \*